(12) United States Patent
Liu et al.

(10) Patent No.: US 11,330,092 B2
(45) Date of Patent: May 10, 2022

(54) LCD DISPLAY MODULE AND MOBILE TERMINAL

(71) Applicant: BEIJING XIAOMI MOBILE SOFTWARE CO., LTD., Beijing (CN)

(72) Inventors: Anyu Liu, Beijing (CN); Shaoxing Hu, Beijing (CN); Jinze Li, Beijing (CN)

(73) Assignee: Beijing Xiaomi Mobile Software Co., Ltd., Beijing (CN)

( * ) Notice: Subject to any disclaimer, the term of this patent is extended or adjusted under 35 U.S.C. 154(b) by 0 days.

(21) Appl. No.: 16/241,930

(22) Filed: Jan. 7, 2019

(65) Prior Publication Data

US 2019/0215390 A1    Jul. 11, 2019

(30) Foreign Application Priority Data

Jan. 10, 2018  (CN) .......................... 201810023212.X

(51) Int. Cl.
*G06F 1/16*     (2006.01)
*H05K 1/18*     (2006.01)
(Continued)

(52) U.S. Cl.
CPC ........ *H04M 1/0277* (2013.01); *G02B 6/0073* (2013.01); *G02F 1/13452* (2013.01); *G02F 1/133308* (2013.01); *G06F 1/1601* (2013.01); *G06F 1/1626* (2013.01); *G06F 1/1637* (2013.01); *G06F 1/1684* (2013.01); *G06F 1/1686* (2013.01); *H04M 1/026* (2013.01); *H04M 1/0264* (2013.01); *H04M 1/0266* (2013.01); *H04N 7/142* (2013.01); *H05K 1/028* (2013.01); *H05K 1/189* (2013.01);

*G02B 6/0051* (2013.01); *G02B 6/0053* (2013.01); *G02B 6/0055* (2013.01); *G02B 6/0083* (2013.01);
(Continued)

(58) Field of Classification Search
None
See application file for complete search history.

(56) References Cited

U.S. PATENT DOCUMENTS 9,735,185 B1 *   8/2017  Evans ................... G06F 1/1605
10,503,297 B2 *  12/2019 Zeng .................... G06F 1/1643
(Continued)

FOREIGN PATENT DOCUMENTS

CN      202394156 U     8/2012
CN      105979696 A     9/2016
(Continued)

OTHER PUBLICATIONS

Extended European search report issued in corresponding European Application No. 19151162.5, dated Mar. 27, 2019, 9 pages.
(Continued)

*Primary Examiner* — James Wu
*Assistant Examiner* — Christopher L Augustin
(74) *Attorney, Agent, or Firm* — Arch & Lake LLP

(57) ABSTRACT

The present disclosure relates an LCD display module and a mobile terminal, the LCD display module includes: a display screen and a flexible printed circuit led out from a top of the display screen, where the top of the display screen is provided with a recessed portion for accommodating a functional module of a mobile terminal, and the flexible printed circuit is provided with an opening at a position corresponding to the recessed portion.

12 Claims, 5 Drawing Sheets

(51) Int. Cl.
  *H04M 1/02* (2006.01)
  *H05K 1/02* (2006.01)
  *H04N 7/14* (2006.01)
  *G02F 1/1345* (2006.01)
  *G02F 1/1333* (2006.01)
  *F21V 8/00* (2006.01)
  *H05K 1/14* (2006.01)
  *H04M 1/22* (2006.01)
  *G02F 1/13357* (2006.01)

(52) U.S. Cl.
  CPC .. *G02F 1/133322* (2021.01); *G02F 1/133325* (2021.01); *G02F 1/133615* (2013.01); *G02F 2201/40* (2013.01); *G02F 2201/56* (2013.01); *H04M 1/22* (2013.01); *H04M 2250/12* (2013.01); *H04N 2007/145* (2013.01); *H05K 1/147* (2013.01); *H05K 2201/056* (2013.01); *H05K 2201/09063* (2013.01); *H05K 2201/09163* (2013.01); *H05K 2201/10136* (2013.01)

(56) References Cited

U.S. PATENT DOCUMENTS

| | | | |
|---|---|---|---|
| 2008/0158472 A1* | 7/2008 | Chung | G02F 1/13452 349/60 |
| 2010/0195017 A1 | 8/2010 | Chuang | |
| 2012/0057367 A1* | 3/2012 | Park | G02F 1/133603 362/606 |
| 2012/0105400 A1 | 5/2012 | Mathew et al. | |
| 2013/0016267 A1* | 1/2013 | Ko | G06F 1/1637 348/333.01 |
| 2015/0346863 A1* | 12/2015 | Morita | G06F 3/041 345/174 |
| 2016/0342250 A1* | 11/2016 | Zhao | G06F 3/041 |
| 2017/0242457 A1* | 8/2017 | Lee | G06F 1/1643 |
| 2017/0262117 A1* | 9/2017 | Huang | G02B 6/0053 |
| 2017/0287992 A1 | 10/2017 | Kwak et al. | |
| 2017/0289324 A1 | 10/2017 | Yeo et al. | |
| 2018/0076412 A1* | 3/2018 | Kim | G06F 1/1637 |
| 2018/0156964 A1* | 6/2018 | Song | G02B 6/0045 |
| 2019/0050094 A1* | 2/2019 | Zeng | H04M 1/0279 |

FOREIGN PATENT DOCUMENTS

| | | |
|---|---|---|
| CN | 106161897 A | 11/2016 |
| CN | 106774647 A | 5/2017 |
| CN | 106878498 A | 6/2017 |
| CN | 107040626 A | 8/2017 |
| CN | 107102474 A | 8/2017 |
| CN | 107370845 A | 11/2017 |
| CN | 107404548 A | 11/2017 |
| CN | 107483674 A | 12/2017 |
| CN | 207782879 U | 8/2018 |
| EP | 3068198 A1 | 9/2016 |
| JP | 2012237826 A | 12/2012 |
| JP | 2017120778 A | 7/2017 |
| KR | 20100090876 A | 8/2010 |
| KR | 1020120122576 A | 11/2012 |
| KR | 20140125540 A | 10/2014 |
| KR | 1020170098373 A | 8/2017 |
| RU | 2638723 C2 | 12/2017 |

OTHER PUBLICATIONS

International Search Report to corresponding PCT Application No. PCT/CN2018/082535 dated Oct. 10, 2018, (17p).
First Office Action to Korean Application No. 10-2018-7030587 dated Oct. 21, 2019 and English translation (11p).
First Office Action to Chinese Application No. 201810023212.X, dated Apr. 17, 2019 and English Translation (11p).
The First Office Action corresponding to Russian Patent Application No. 2018145749/07(076484) dated Aug. 1, 2019 and English translation, (12p).
Second Office Action issued to Chinese Patent Application No. 201810023212.X, dated Jan. 10, 2020, 2020 with English translation (11p).
First Office Action to Japanese Application No. 2018-530509, dated Feb. 21, 2020, (6p).
First Korean Office Action issued to Korean Patent Application No. 20207021410, dated Oct. 16, 2020 with English translation, (10p).

* cited by examiner

LCD DISPLAY MODULE AND MOBILE TERMINAL

CROSS-REFERENCE TO RELATED APPLICATIONS

This application is based upon and claims priority to Chinese Patent Application No. 201810023212.X, filed Jan. 10, 2018, the entire content of which is incorporated herein by reference for all purposes.

TECHNICAL FIELD

The present disclosure relates to the technical field of display screens, and in particular, to a Liquid Crystal Display (LCD) display module and a mobile terminal.

BACKGROUND

As the mobile terminals such as smart phones have become an integral part of people's lives, in order to increase visual enjoyment of the users of the mobile terminals, the mobile terminals such as mobile phones with a high screen occupancy ratio are increasingly favored.

SUMMARY

The present disclosure provides an LCD display module with a high screen occupation ratio and a mobile terminal having the same. The present disclosure also provides a method of manufacturing an LCD display module.

According to a first aspect of the present disclosure, an LCD display module is provided. The LCD display module may include: a display screen and a flexible printed circuit led out from a top of the display screen, where the top of the display screen may be provided with a recessed portion for accommodating a functional module of a mobile terminal, and the flexible printed circuit is provided with an opening at a position corresponding to the recessed portion on the top of the display screen.

According to a second aspect of the present disclosure, a mobile terminal is provided. The mobile terminal may include: a terminal body, a functional module disposed on the terminal body, and an LCD display module, where a flexible printed circuit may be led out from a top of the display screen and the top of the display screen is provided with a recessed portion for accommodating a functional module of a mobile terminal, and the flexible printed circuit is provided with an opening at a position corresponding to the recessed portion on the top of the display screen, and where the LCD display module may be mounted on the terminal body, the functional module may be mounted in the recessed portion of the LCD display module, and the flexible printed circuit of the LCD display module is bent to be electrically connected to a control main board of the terminal.

According to a third aspect of the present disclosure, a method of manufacturing an LCD display module is provided. The method may include: providing a display screen and providing a flexible printed circuit that is led out from a top of the display screen; providing a recessed portion for accommodating a functional module of a mobile terminal on the top of the display screen, where the flexible printed circuit may be provided with an opening at a position corresponding to the recessed portion on the top of the display screen.

It is to be understood that both the foregoing general description and the following detailed description are exemplary only and are not restrictive of the present disclosure.

BRIEF DESCRIPTION OF THE DRAWINGS

To explain the technical solutions in the examples of the present disclosure, hereinafter, the drawings required for describing the examples will be introduced. The drawings described below are only some examples in the present disclosure. Other drawings may be obtained according to these drawings.

DETAILED DESCRIPTION

The present disclosure will be described in detail below with reference to specific examples illustrated in the accompanying drawings. However, these examples do not limit the present disclosure, and structural, methodological, or functional changes made by those skilled in the art based on these examples are all included in the protection scope of the present disclosure.

The terminology used in the present disclosure is for the purpose of describing particular examples only and is not intended to limit the present disclosure. As used in this disclosure and the appended claims, the singular forms "a", "an", and "the" are intended to include the plural forms as well, unless the context clearly indicates otherwise. It should also be understood that the term "and/or" as used herein refers to and includes any and all possible combinations of one or more of the associated listed items.

It shall be understood that, although the terms "first," "second," "third," and the like may be used herein to describe various information, the information should not be limited by these terms. These terms are only used to distinguish one category of information from another. For example, without departing from the scope of the present disclosure, first information may be termed as second information; and similarly, second information may also be termed as first information. As used herein, the term "if" may be understood to mean "when" or "upon" or "in response to" depending on the context.

The examples of the present disclosure will be described in detail below in conjunction with the accompanying drawings. The following examples and features in the examples may be combined with each other.

The screen occupation ratio generally refers to a ratio of the screen and an area of a front panel of a mobile terminal such as a mobile phone. The ratio maybe a parameter that is relatively easy to obtain on the appearance design of the mobile phone. Some mobile terminals such mobile phones have a small screen occupancy ratio. The upper and lower borders may occupy a large proportion of the screen due to the handset, for example, the borders may include the camera, the HOME key, and the like. Thus, the borders may cause a relatively low utilization ratio of the screen under the premise of the appearance. As such, there is a need to increase the screen occupation ratio while maintaining the overall size and reduce the upper and lower borders of the mobile phone to give the consumers a better visual experience.

Figure 1:
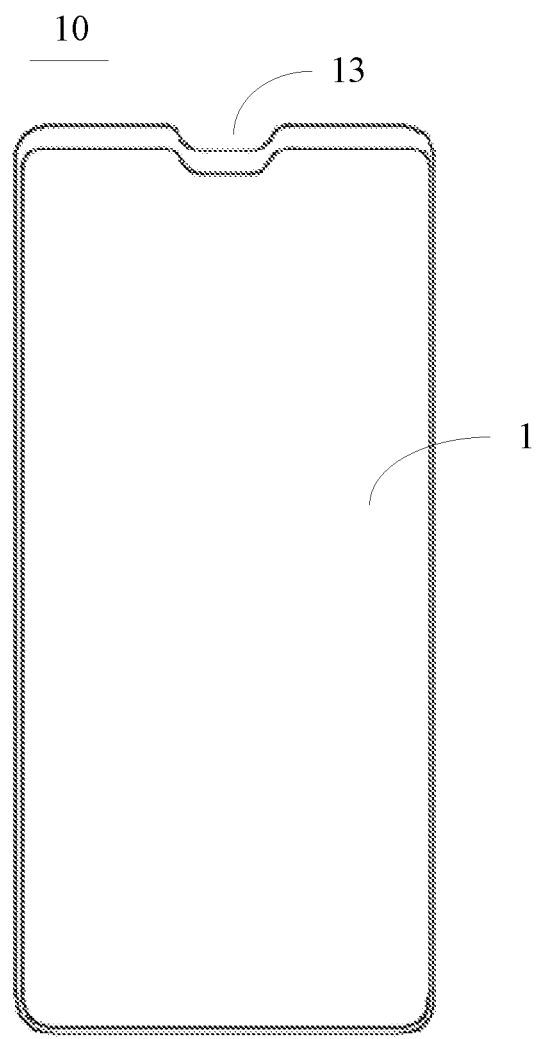
FIG. 1 is a schematic structural diagram of an LCD display module according to an example of the present disclosure.
Figure 2:
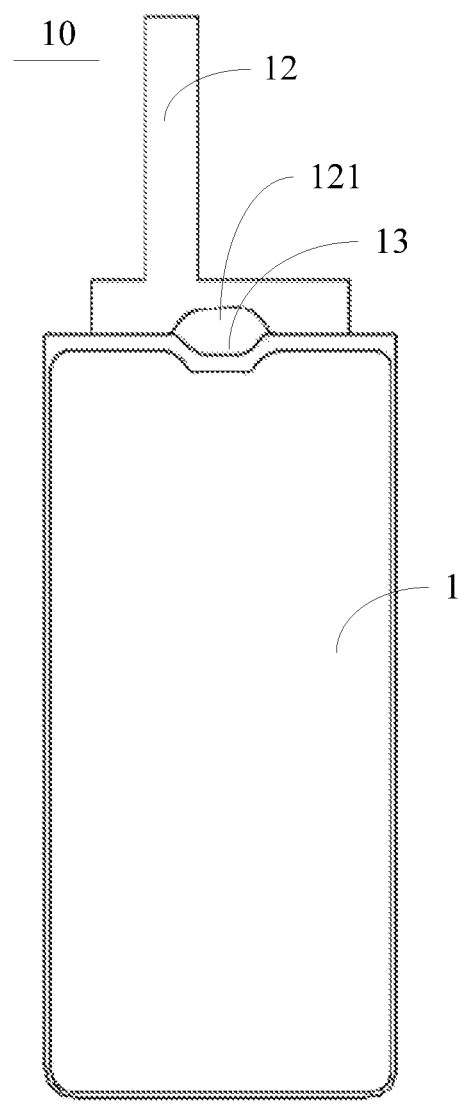
FIG. 2 is a schematic diagram of a state in which a flexible printed circuit is unfolded with respect to a display screen in the LCD display module according to an example of the present disclosure.

As shown in FIG. 1 and FIG. 2, an Liquid Crystal Display (LCD) display module 10 according to an example of the present disclosure includes a display screen 1 and a Flexible Printed Circuit (FPC) led out from a top of the display screen 12. In this example, the integrated circuit in the LCD display module 10 is disposed on the top of the display screen 1. The flexible printed circuit 12 is electrically connected to the integrated circuit and is led out from the top of the display screen 1.

Figure 5:
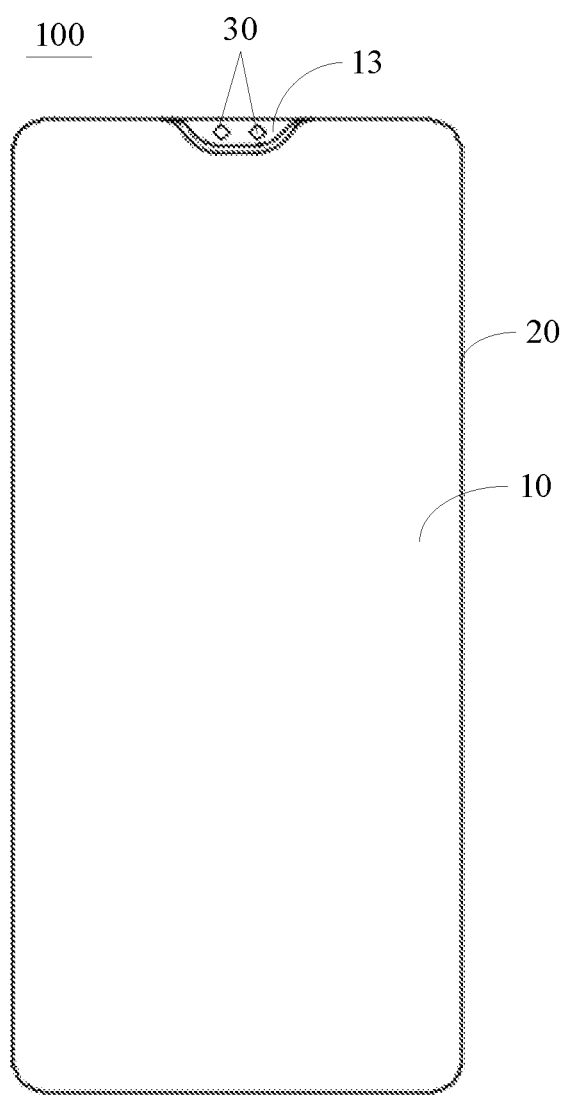
FIG. 5 is a schematic structural diagram of a mobile terminal according to an example of the present disclosure.

As shown in FIG. 1, FIG. 2 and FIG. 5, the top of the display screen 1 is provided with a recessed portion 13 for accommodating a functional module 30 of the mobile terminal 100. The flexible printed circuit 12 is provided with an opening 121 at a position corresponding to the recessed portion 13. In this way, the LCD display module 10 has a receiving space for accommodating the functional module 30 on the mobile phone, and individual modules in the LCD display module 10 that need to occupy a display area of the display screen 1 are uniformly arranged on the top of the mobile phone, so that a screen occupation ratio of the bottom of the mobile phone is maximized as much as possible, and thus the overall screen occupation ratio of the LCD display module 10 is increased as much as possible. The functional module 30 may include at least one of a camera, a sensor (at least one of various types of sensors, such as an infrared sensor, a light sensor, a distance sensor, etc.), a photosensitive element, and an earphone.

The mobile terminal 100 in the present disclosure may be an electronic device such as a mobile phone, a tablet computer, a palmtop computer, or a Personal Digital Assistant (PDA). In the present disclosure, the mobile terminal 100 is specifically described by using a mobile phone as an example. It should be noted that the top of the display screen 1 is an upper end of the mobile phone when the user holds the mobile phone according to using habit; and the bottom of the display screen 1 is a lower end of the mobile phone when the user holds the mobile phone according to using habit.

As shown in FIG. 1 to FIG. 3 and FIG. 5, the recessed portion 13 of the present disclosure may be disposed at any position on the top of the display screen 1. Specifically, the recessed portion 13 may be disposed according to a user's satisfactory experience. In an alternative example, the recessed portion 13 is located at a middle position of the display screen 1, and the middle position is obtained by using a center line of the display screen 1 in a longitudinal direction as a reference line. In a further alternative example, the recessed portion 13 is located on a left or right side of the display screen 1. The recessed portion 13 may also be located at the bottom side of the display screen. The recessed portion 13 may not be in the middle portion of each side, the recessed portion 13 may be located at anywhere along the side of the display screen. Sometimes, it is possible to have more than one recessed portions along on the side of the display screen.

In the example of the present disclosure, the recessed portion 13 may have an arc shape, an inverted trapezoidal shape, a U-shape, a W-shape or the like. Herein, it should be noted that the above listed shapes of the recessed portion 13 are not absolutely the standard shapes, and the recessed portion 13 as a whole having a shape substantially as described above is also within the protection scope of the present disclosure. The recessed portion 13 may also be any irregular shape or a plurality of inconsistent accommodation spaces.

Figure 3:
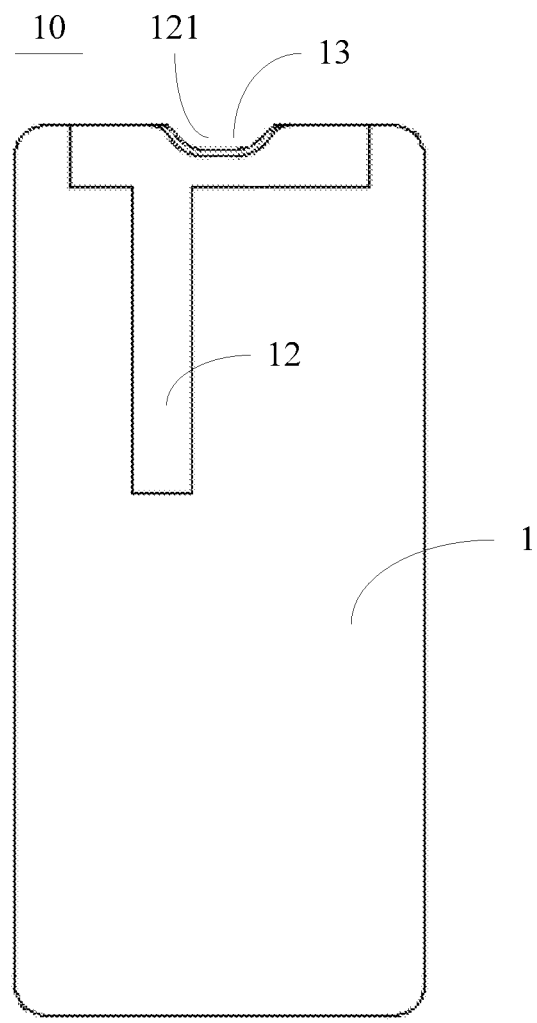
FIG. 3 is a schematic diagram of a state in which the flexible printed circuit is bent on a back of a display screen in the LCD display module according to an example of the present disclosure.

In the present disclosure, when the LCD display module 10 is mounted on a terminal body 20 of the mobile terminal 100, the flexible printed circuit 12 is bent to be electrically connected with a control main board (not shown) on the terminal body 20. After the LCD display module 10 is mounted on the terminal body 20, the flexible printed circuit 12 is located between the LCD display module 10 and the terminal body 20. When the flexible printed circuit 12 is bent to be electrically connected with the control main board of the mobile terminal 100, an edge of the opening 121 of the flexible printed circuit 12 does not exceed an edge of the recess 13. That is, the flexible printed circuit 12 is adapted to avoid the functional module 30 on the mobile phone. As shown in FIG. 3, when the flexible printed circuit 12 is bent to be electrically connected with the control main board of the mobile terminal 100, the edge of the opening 121 coincides with the edge of the recess 13, so that the flexible printed circuit 12 can avoid the functional module 30 of the mobile phone, and meanwhile, there is a space as large as possible for layout of the circuit, thereby reducing the difficulty of the layout of the circuit.

Figure 4:
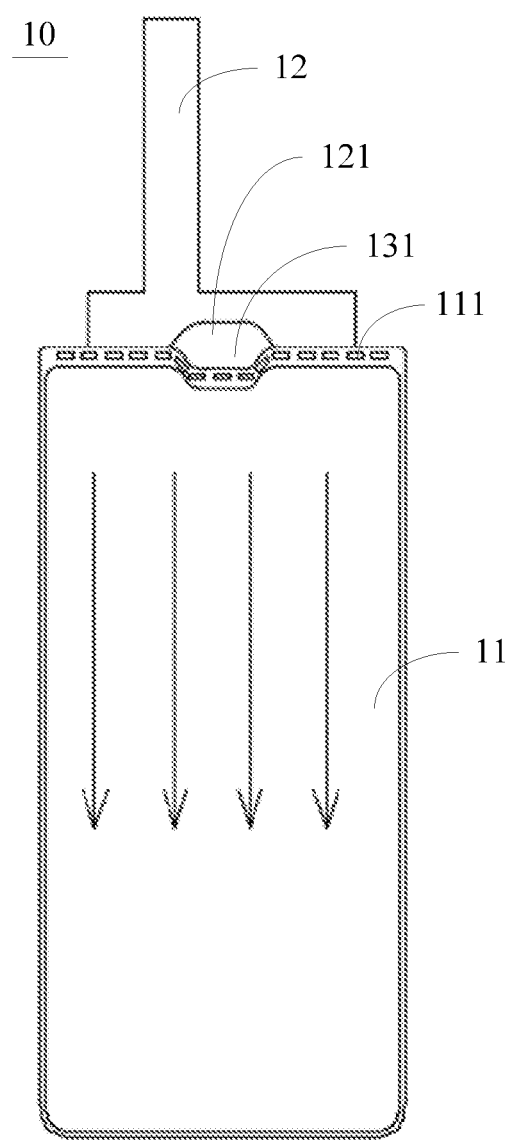
FIG. 4 is a schematic structural diagram of a backlight module in the LCD display module according to an example of the present disclosure.

As shown in FIG. 4 in combination with FIG. 1 and FIG. 5, the display screen 1 includes a backlight module 11, a display panel (not shown), and a touch panel (not shown). The flexible printed circuit 12 is electrically connected to an integrated circuit in the display panel. The top of the backlight module 11, the top of the display panel, and the top of the touch panel are all provided with a recessed structure 131, which forms a part of the recessed portion 13. That is, the recessed structure 131 on the top of the backlight module 11, the recessed structure on the top of the display panel, and the recessed structure on the top of the touch panel are correspondingly arranged and constitute the recessed portion 13 of the present disclosure.

The backlight module 11 may include a LED (Light Emitting Diode) light strip array 111. The LED light strip array 111 is located at a top edge of the backlight module 11 and passes through the edge of the recess 13. In this example, the LED light strip array 111 is evenly disposed on the entire top of the backlight module 11, so that the overall display brightness on the LCD display module 10 is balanced. In the LED layout at the position of the recessed portion 13, the LED light strip array 111 of this segment is disposed at the edge of the recessed portion 13.

Further, the backlight module 11 may further include a light guide plate (not shown) that cooperates with the LED light strip array 111. The light guide plate is used to guide the light emitted by the LED light strip array 111 from the top of the display screen 1 to the bottom of the display screen 1. Through the optimization of the light guide plate, finally a balanced display effect is achieved. The backlight module 11 of the present disclosure also includes an emission sheet, a reflective back-adhesive, a plastic frame, a diffusion sheet, a lower brightness enhancement sheet, an upper brightness enhancement sheet, a brightness enhancement tape, and the like. The display panel may also include a lower polarizer, a liquid crystal cell, an upper polarizer, and the like. The touch panel includes a touch screen, an optical adhesive, and the like.

In the examples of the present disclosure, the recessed portion is not limited to be provided at the top of the display screen, and the recessed portion may also be disposed at the bottom of the display screen. Correspondingly, the integrated circuit of the LCD module and the flexible printed circuit are also set at the bottom of the display. The example of the recessed portion, the flexible printed circuit, etc. in the LCD module is the same as the example in which the recessed portion is disposed on the top of the display screen, and will not be repeated here.

In the present disclosure, the flexible printed circuit may be electrically connected to the top of the LCD display module by changing the circuit in the LCD display module. The top of the LCD display module is provided with a recessed portion, and the flexible printed circuit is correspondingly provided with an opening for accommodating the functional module of the mobile terminal. In this example, except for the recessed portion of the display screen, other positions of the display screen are display areas, so that the requirement for increasing the screen occupation ratio of the display screen can be satisfied as much as possible.

As shown in FIG. 5, according to another aspect of an example of the present disclosure, a mobile terminal 100 is further provided. The mobile terminal 100 includes a terminal body 20, a functional module 30 disposed on the terminal body 20, and an LCD display module 10. The specific structural features of the LCD display module 10 are as shown in the above examples, and will not be repeated here. The mobile terminal 100 in the present disclosure may be an electronic device such as a mobile phone, a tablet computer, a palmtop computer, a personal digital assistant, etc. In the present disclosure, the mobile terminal 100 will be specifically described by taking a mobile phone as an example.

The terminal body 20 may include a terminal housing (not shown), a control main board (not shown) mounted in the terminal housing, and a battery (not shown) assembled in the terminal housing. The battery is electrically connected to the control main board for powering the control main board. The LCD display module 10 of the present disclosure is mounted on the terminal body 20, and the functional module 30 is mounted in the recessed portion 13 of the LCD display module 10. The flexible printed circuit of the LCD display module 10 is bent to be electrically connected to the control main board of the terminal body 20. That is, the flexible printed circuit is bent relative to the display screen of the LCD display module 10, so that after the LCD module 10 is assembled in the terminal body 20, the flexible printed circuit is located between the display screen and the terminal body 20.

The functional module 30 of the present disclosure may include at least one of a camera, a sensor (at least one of various types of sensors, such as an infrared sensor, a light sensor, a distance sensor, etc.), a photosensitive element, and an earphone.

The present disclosure designs an LCD display module and a mobile terminal having the same. The flexible printed circuit is electrically connected to the top of the LCD display module by changing the circuit in the LCD display module. The top of the LCD display module is provided with a recessed portion, and the flexible printed circuit is correspondingly provided with an opening for accommodating the functional module of the mobile terminal. In this example, except for the recessed portion of the display screen, other positions of the display screen are display areas, so that the requirement for increasing the screen occupation ratio of the display screen can be satisfied as much as possible.

The present disclosure designs an LCD display module and a mobile terminal having the same. By changing the circuit in the LCD display module, the flexible printed circuit is electrically connected to the top of the LCD display module.

The present disclosure discloses a method of manufacturing an LCD display module. The method may include providing a display screen and providing a flexible printed circuit that is led out from a top of the display screen; providing a recessed portion for accommodating a functional module of a mobile terminal on the top of the display screen, where the flexible printed circuit may be provided with an opening at a position corresponding to the recessed portion on the top of the display screen.

The technical solutions provided by the examples of the present disclosure may include the following advantageous effects: the present disclosure designs an LCD display module and a mobile terminal having the same, by changing the circuit in the LCD display module, the flexible printed circuit is electrically connected to the top of the LCD display module, the top of the LCD display module is provided with a recessed portion, and the flexible printed circuit is correspondingly provided with an opening for accommodating the functional module of the mobile terminal, so as to meet the requirement of increasing a screen occupation ratio of the display screen.

The present disclosure may include dedicated hardware implementations such as application specific integrated circuits, programmable logic arrays and other hardware devices. The hardware implementations can be constructed to implement one or more of the methods described herein. Applications that may include the apparatus and systems of various examples can broadly include a variety of electronic and computing systems. One or more examples described herein may implement functions using two or more specific interconnected hardware modules or devices with related control and data signals that can be communicated between and through the modules, or as portions of an application-specific integrated circuit. Accordingly, the computing system disclosed may encompass software, firmware, and hardware implementations. The terms "module," "sub-module," "circuit," "sub-circuit," "circuitry," "sub-circuitry," "unit," or "sub-unit" may include memory (shared, dedicated, or group) that stores code or instructions that can be executed by one or more processors. The module refers herein may include one or more circuit with or without stored code or instructions. The module or circuit may include one or more components that are connected.

Other examples of the present disclosure will be apparent to those skilled in the art from consideration of the specification and practice of the contents disclosed here. This application is intended to cover any variations, uses, or adaptations of the present disclosure following the general principles thereof and including such departures from the present disclosure as come within known or customary practice in the art. It is intended that the specification and examples be considered as exemplary only, with a true scope and spirit of the present disclosure being indicated by the claims of the present application.

It will be appreciated that the present disclosure is not limited to the exact construction that has been described above and illustrated in the accompanying drawings, and that various modifications and changes can be made without departing from the scope thereof.

What is claimed is:

1. A Liquid Crystal Display (LCD) display module, comprising:

a display screen and a flexible printed circuit led out from a top of the display screen, the display screen consisting of a recessed portion and a display area, wherein the flexible printed circuit extends from an upper edge of the display area of the display screen;

wherein the top of the display screen is provided with the recessed portion which is an indented non-display area along a top edge of the display area of the display screen for accommodating a functional module of a mobile terminal, a bottom edge of the recessed portion is in direct contact with the top edge of the display area of the display screen, and the flexible printed circuit is provided with an opening along an edge of the flexible printed circuit, at a position corresponding to the recessed portion on the top of the display screen;

wherein, when the display screen and the flexible printed circuit are connected, the recessed portion of the display screen and the opening of the flexible printed circuit each constitute a part of one aperture;

wherein, when the flexible printed circuit is bent on a back of the display screen, an edge of the opening does not exceed an edge of the recessed portion, and wherein, when the flexible printed circuit is bent on the back of the display screen, the edge of the opening matches the edge of the recessed portion so that the flexible printed circuit avoids the functional module of the mobile terminal.

2. The LCD display module according to claim 1, wherein the recessed portion is located at a middle position on the top of the display screen.

3. The LCD display module according to claim 1, wherein the recessed portion is located on a left side or a right side of the display screen.

4. The LCD display module according to claim 1, wherein the recessed portion is arc-shaped, inverted trapezoidal, U-shaped, or W-shaped.

5. The LCD display module according to claim 1, wherein the display screen comprises a backlight module, a top of the backlight module is provided with a recessed structure, and the recessed structure constitutes a part of the recessed portion.

6. The LCD display module according to claim 5, wherein the backlight module comprises a light emitting diode (LED) light strip array, and the LED light strip array is located at a top edge of the backlight module and passes through an edge of the recessed portion.

7. The LCD display module according to claim 6, wherein the backlight module further comprises a light guide plate that cooperates with the LED light strip array, and the light guide plate is used to guide light emitted by the LED light strip array from the top of the display screen to a bottom of display screen.

8. A mobile terminal, comprising: a terminal body, a functional module disposed on the terminal body, and an LCD display module;

wherein the LCD display module comprises a display screen and a flexible printed circuit led out from a top of the display screen, the display screen consists of a recessed portion and a display area, wherein the flexible printed circuit extends from an upper edge of the display area of the display screen;

wherein the top of the display screen is provided with the recessed portion which is an indented non-display area along a top edge of the display area of the display screen for accommodating a functional module of a mobile terminal, a bottom edge of the recessed portion is in direct contact with the top edge of the display area of the display screen, and the flexible printed circuit is provided with an opening along an edge of the flexible printed circuit, at a position corresponding to the recessed portion on the top of the display screen;

wherein the LCD display module is mounted on the terminal body, the functional module is mounted in the recessed portion of the LCD display module, and the flexible printed circuit of the LCD display module is bent to be electrically connected to a control main board of the terminal body;

wherein, when the display screen and the flexible printed circuit are connected, the recessed portion of the display screen and the opening of the flexible printed circuit each constitute a part of one aperture;

wherein, when the flexible printed circuit is bent on a back of the display screen, an edge of the opening does not exceed an edge of the recessed portion, and wherein, when the flexible printed circuit is bent on the back of the display screen, the edge of the opening matches the edge of the recessed portion so that the flexible printed circuit avoids the functional module of the mobile terminal.

9. The mobile terminal according to claim 8, wherein the functional module comprises at least one of: a camera, a sensor, a photosensitive element, and an earphone.

10. A method of manufacturing an LCD display module, comprising:

providing a display screen and a flexible printed circuit that is led out from a top of the display screen, the display screen consisting of a recessed portion and a display area, wherein the flexible printed circuit extends from an upper edge of the display area of the display screen; and providing the recessed portion which is an indented non-display area along a top edge of the display area of the display screen for accommodating a functional module of a mobile terminal on the top of the display screen, wherein a bottom edge of the recessed portion is in direct contact with the top edge of the display area of the display screen, and the flexible printed circuit is provided with an opening along an edge of the flexible printed circuit, at a position corresponding to the recessed portion on the top of the display screen;

wherein, when the display screen and the flexible printed circuit are connected, the recessed portion of the display screen and the opening of the flexible printed circuit each constitute a part of one aperture;

wherein, when the flexible printed circuit is bent on a back of the display screen, an edge of the opening does not exceed an edge of the recessed portion, and wherein, when the flexible printed circuit is bent on the back of the display screen, the edge of the opening matches the edge of the recessed portion so that the flexible printed circuit avoids the functional module of the mobile terminal.

11. The method according to claim 10, wherein the recessed portion is located at a middle position on the top of the display screen.

12. The method according to claim 10, wherein the recessed portion is arc-shaped, inverted trapezoidal, U-shaped, or W-shaped.

* * * * *